US012647090B2

(12) United States Patent
Wang et al.

(10) Patent No.: US 12,647,090 B2
(45) Date of Patent: Jun. 2, 2026

(54) CAPACITIVE COUPLING ISOLATION DEVICE AND RECEIVING CIRCUIT

(71) Applicant: LITE-ON SINGAPORE PTE. LTD., Singapore (SG)

(72) Inventors: You-Fa Wang, Singapore (SG); Chee-Wan Go, Singapore (SG); Jonah Mendoza Herrera, Singapore (SG)

(73) Assignee: LITE-ON SINGAPORE PTE. LTD., Singapore (SG)

( * ) Notice: Subject to any disclaimer, the term of this patent is extended or adjusted under 35 U.S.C. 154(b) by 0 days.

(21) Appl. No.: 18/922,367

(22) Filed: Oct. 21, 2024

(65) Prior Publication Data

US 2025/0132745 A1    Apr. 24, 2025

(30) Foreign Application Priority Data

Oct. 23, 2023    (SG) ............................ 10202302989V
Sep. 6, 2024    (CN) .......................... 202411244792.7

(51) Int. Cl.
*H03H 7/01*        (2006.01)
*H03K 17/687*        (2006.01)

(52) U.S. Cl.
CPC ....... *H03H 7/0138* (2013.01); *H03K 17/6871* (2013.01)

(58) Field of Classification Search
CPC ......................... H03H 7/0138; H03K 17/6871
USPC ....................................................... 327/552
See application file for complete search history.

(56) References Cited

U.S. PATENT DOCUMENTS

| | | | | |
|---|---|---|---|---|
| 8,502,584 B1 * | 8/2013 | Dong | ...................... | H04B 3/30 |
| | | | | 375/219 |
| 9,306,609 B1 * | 4/2016 | LaCroix | ................. | H04B 3/548 |
| 9,634,646 B1 * | 4/2017 | Ha | ...................... | H04L 25/0278 |
| 9,698,728 B2 * | 7/2017 | Kamath | .................. | H03D 3/00 |
| 10,516,366 B2 * | 12/2019 | Yong | ......................... | H03L 7/06 |
| 10,840,960 B1 * | 11/2020 | Al-Shyoukh | ......... | H03F 3/3001 |
| 11,240,070 B1 * | 2/2022 | Lin | ...................... | H03K 5/2481 |
| 11,356,135 B2 * | 6/2022 | Briseno-Vidrios | .......................... | |
| | | | | H03K 19/017509 |
| 11,483,181 B1 * | 10/2022 | Nasum Subramanyam | ................ | |
| | | | | H04L 25/0266 |
| 12,028,028 B2 * | 7/2024 | Dong | ...................... | H03F 3/387 |
| 12,184,335 B2 * | 12/2024 | Nguyen | .............. | H04B 10/564 |
| 12,294,335 B2 * | 5/2025 | Al-Shyoukh | ....... | H03F 3/45237 |

(Continued)

*Primary Examiner* — Ryan Jager
(74) *Attorney, Agent, or Firm* — Li & Cai Intellectual Property Office

(57)        ABSTRACT
A capacitive coupling isolation device and a receiving circuit are provided. The capacitive coupling isolation device includes an external coupling capacitor and the receiving circuit. The external coupling capacitor is electrically connected to a transmitting circuit and the receiving circuit. The receiving circuit includes a protection circuit architecture, which includes an input bonding pad structure and a filter resistor. The input bonding pad structure is formed by alternatively disposing patterned metal layers and dielectric layers, and the input bonding pad structure includes a pad capacitor and a filter capacitor. The pad capacitor is electrically connected to the external coupling capacitor and a filter capacitor. The filter capacitor and the filter resistor are both electrically connected to the pad capacitor and a ground end. The filter capacitor and filter resistor form a low-pass filter. The external coupling capacitor is a built-in package capacitor.

24 Claims, 6 Drawing Sheets

(56) References Cited

U.S. PATENT DOCUMENTS

| | | | |
|---|---|---|---|
| 2009/0001514 A1* | 1/2009 | Bae | H10D 1/68 |
| | | | 257/532 |
| 2010/0284452 A1* | 11/2010 | Allen | H04L 25/4917 |
| | | | 375/220 |
| 2012/0019968 A1 | 1/2012 | Hsieh et al. | |
| 2017/0117877 A1* | 4/2017 | Ha | H04L 25/0278 |
| 2020/0014357 A1 | 1/2020 | Shay et al. | |
| 2021/0202405 A1 | 7/2021 | SubramanyamNasum et al. | |
| 2022/0353112 A1* | 11/2022 | Nasum Subramanyam | |
| | | | H04L 25/0272 |
| 2023/0283250 A1* | 9/2023 | Uberti | H03F 3/45704 |
| | | | 330/252 |
| 2025/0132745 A1* | 4/2025 | Wang | H03H 7/0138 |
| 2025/0167745 A1* | 5/2025 | Uberti | H03F 3/211 |

* cited by examiner

CAPACITIVE COUPLING ISOLATION DEVICE AND RECEIVING CIRCUIT

CROSS-REFERENCE TO RELATED PATENT APPLICATION

This application claims the benefit of priority to China Patent Application No. 202411244792.7, filed on Sep. 6, 2024, in the People's Republic of China. The entire content of the above identified application is incorporated herein by reference.

This application claims the benefit of priority to the Singapore Provisional Patent Application Ser. No. 10202302989V, filed on Oct. 23, 2023, which application is incorporated herein by reference in its entirety.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to an isolation device, and more particularly to a capacitive coupling isolation device.

BACKGROUND OF THE DISCLOSURE

In the existing capacitive coupling isolators, two types of architectures are utilized. The first type is an architecture with an on-chip isolation and coupling capacitor, for example, the transmitter integrated circuit (IC) and the receiver IC in which high-voltage isolation coupling capacitors are built; the second type is an architecture with a built-in package isolation and coupling capacitor isolator, in which the high-voltage isolation coupling capacitor is built in the package rather than being set in the transmitter circuit and the receiver circuit.

For on-chip isolation and coupling capacitors, special semiconductor processes are required. To meet isolation voltage requirements, the capacitors must have a sufficiently thick dielectric layer and maintain a predetermined distance between the electrodes and other circuits to prevent electric field coupling between circuits. This results in increased sizes of the transmitter and receiver circuits.

In built-in package isolation and coupling capacitor isolators, high breakdown voltage (HV) capacitors are not utilized in the transmitter and receiver circuits (referred to as off-chip transmitter and off-chip receiver circuits). In this type of isolator, the input pad of the off-chip receiver circuit is connected to the built-in package isolation coupling capacitor through wire bonding. However, during the packaging process of this type of isolator, there are electrostatic discharge (ESD) issues, especially during die bonding and wire bonding processes. Although conventional methods can add ESD components (e.g., Zener diodes) directly to the input pad of the off-chip receiver circuit to protect it from ESD events. However, these additional ESD components can lead to poor common mode transient immunity (CMTI) performance, making the isolator unable to meet CMTI requirements.

SUMMARY OF THE DISCLOSURE

In response to the above-referenced technical inadequacies, the present disclosure provides a receiving circuit with a protection circuit architecture and a capacitive coupling isolation device with the receiving circuit to prevent electrostatic discharge events from causing damage to the receiving circuit.

In order to solve the above-mentioned problems, one of the technical aspects adopted by the present disclosure is to provide a capacitive coupling isolation device, which includes an external coupling capacitor and a receiving circuit. The external coupling capacitor has one end electrically connected to a transmitting circuit. The receiving circuit is electrically connected to another end of the external coupling capacitor, and the receiving circuit includes a protection circuit architecture. The protection circuit architecture includes an input bonding pad structure and a filter resistor. The input bonding pad structure is formed by alternatively disposing a plurality of patterned metal layers and a plurality of dielectric layers, and the input bonding pad structure includes a pad capacitor and a filter capacitor. A first end of the pad capacitor is electrically connected to the another end of the external coupling capacitor, and a filter capacitor is electrically connected to a second end of the pad capacitor and a ground end. The filter capacitor is electrically connected to a second end of the pad capacitor and a ground end. The filter capacitor and the filter resistor form a low-pass filter. The external coupling capacitor is a built-in package capacitor that includes a first electrode plate and a second electrode plate, the first electrode plate is electrically connected to the transmitting circuit, and the second electrode plate is electrically connected to the first end of the pad capacitor.

In order to solve the above-mentioned problems, another one of the technical aspects adopted by the present disclosure is to provide a capacitive coupling isolation device, which includes an external coupling capacitor and a receiving circuit. A first end of the external coupling capacitor is electrically connected to a transmitting circuit. The receiving circuit is electrically connected to a second end of the external coupling capacitor, and the receiving circuit includes a protection circuit architecture. The protection circuit architecture includes an input bonding pad structure, a filter resistor and a DC isolation capacitor. The input bonding pad structure is formed by alternatively disposing a plurality of patterned metal layers and a plurality of dielectric layers, and the input bonding pad structure includes a filter capacitor electrically connected to the second end of the external coupling capacitor and a ground end. The filter resistor is electrically connected to the second end of the external coupling capacitor and the ground end, and the filter capacitor and the filter resistor form a low-pass filter. The DC isolation capacitor electrically connected to the second end of the external coupling capacitor and a core circuit of the receiving circuit.

In order to solve the above-mentioned problems, yet another one of the technical aspects adopted by the present disclosure is to provide a receiving circuit suitable for an isolation device. The receiving circuit includes a protection circuit architecture. The protection circuit architecture includes an input bonding pad structure and a filter resistor. The input bonding pad structure at least includes a first patterned metal layer, a second patterned metal layer, a first dielectric layer located between the first patterned metal layer and the second patterned metal layer, a third patterned metal layer, and a second dielectric layer located between the second patterned metal layer and the third patterned metal layer, the second patterned metal layer, the second dielectric layer, and the third patterned metal layer form a filter capacitor, one end of the filter capacitor is electrically connected to an external coupling capacitor through the first patterned metal layer, and another end of the filter capacitor is electrically connected to a ground end. The filter resistor is electrically connected to the second patterned metal layer and the ground end, and the filter capacitor and the filter resistor form a low-pass filter.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
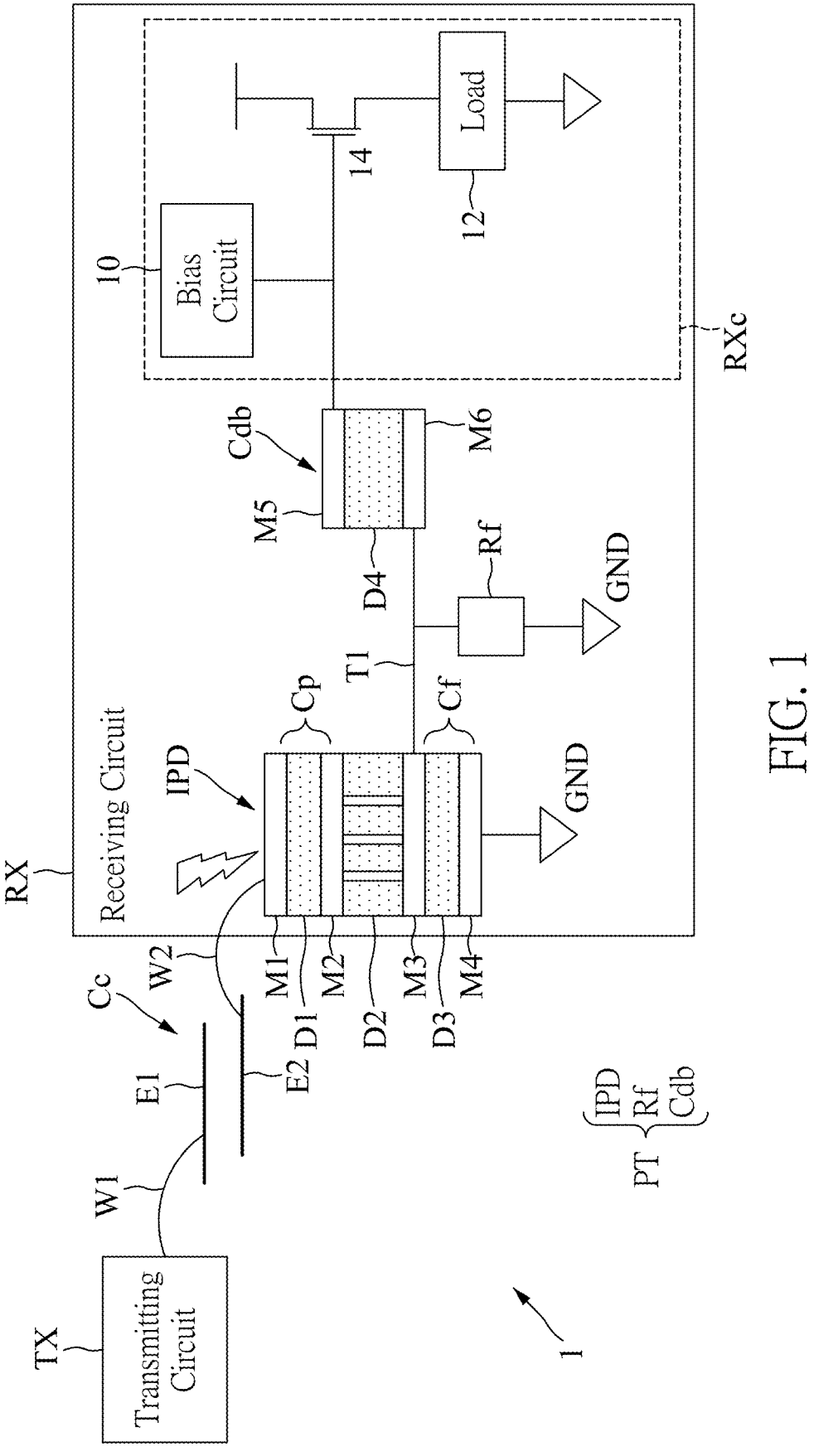
FIG. 1 is a schematic diagram of a capacitive coupling isolation device according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

First Embodiment

FIG. 1 is a schematic diagram of a capacitive coupling isolation device according to a first embodiment of the present disclosure. For ease of understanding and explanation, a built-in package capacitive coupling isolation device is taken as an example of the capacitive coupling isolation device of the present embodiment. In the capacitive coupling isolation device 1, the transmitter circuit TX and the receiver circuit RX are operating in differential modes to meet common mode transient immunity (CMTI) requirements. There are "+" and "−" physical links between the transmitter circuit TX and the receiver circuit RX for each communication channel. The following examples of the "+" and the "−" physical links are the same. For simplicity, one physical link is explained.

Referring to FIG. 1, a first embodiment of the present disclosure provides one physical link of a differential modes of a capacitive coupling isolation device 1, which includes a transmitting component and a receiving component. The transmitting component is, for example, a transmitting integrated circuit (TX IC) die, which includes a transmitting circuit TX; the receiving component is, for example, a receiving integrated circuit (RX IC) die, which includes a receiving circuit RX. In addition, the capacitive coupling isolation device 1 further includes an external coupling capacitor Cc coupled between the transmitting component and the receiving component, and a protection circuit architecture PT. The protection circuit architecture PT is applicable to the receiving circuit RX. Specifically, the protection circuit architecture PT is formed in the receiving circuit RX, and includes an input bonding pad structure IPD and a filter resistor Rf. However, in other embodiments, the protection circuit architecture PT can further include a direct current (DC) block capacitor Cdb.

The external coupling capacitor Cc is a built-in package capacitor, which includes a first electrode plate E1, a second electrode plate E2, and a dielectric layer disposed between the first electrode plate E1 and the second electrode plate E2. For the convenience of representation, the dielectric layer is not shown in FIG. 1. A first end (i.e., the first electrode plate E1) of the external coupling capacitor Cc can be electrically connected to the transmitting circuit TX. In some embodiments, the first electrode plate E1 is electrically connected to the transmitting circuit TX by a first bonding wire W1, and the second electrode plate E2 is electrically connected to the input bonding pad structure IPD by a second bonding wire W2, but the present disclosure is not limited thereto. The present disclosure does not limit a manner in which the first electrode plate E1 is electrically connected to the transmitting circuit TX, and a manner in which the second electrode plate E2 is electrically connected to the input bonding pad structure IPD.

Specifically, the input bonding pad of the receiving circuit RX forms an input bonding pad structure IPD, which includes a plurality of patterned metal layers and a plurality of dielectric layers. Referring to FIG. 1, for example, patterned metal layers M1, M2, M3, and M4 and dielectric layers D1, D2, and D3 are stacked alternately. The patterned metal layers M1, M2, M3 and M4 can be made of conductive metal materials, such as copper; and the dielectric layers D1, D2 and D3 can be made of non-conductive materials, such as silicon dioxide (SiO2). In the input bonding pad structure IPD, a bonding pad capacitor Cp and a filter capacitor Cf can be further formed. In addition, the input bonding pad structure IPD can be formed by connecting a bonding pad capacitor Cp and a filter capacitor Cf in series, but the present disclosure is not limited thereto.

From the circuit layout, a first end of the bonding pad capacitor Cp can be electrically connected to a second end of the external coupling capacitor Cc (i.e., the second electrode plate E2) through the second bonding wire W2. The filter capacitor Cf is electrically connected to the second end of the bonding pad capacitor Cp and the ground end GND. In addition, the filter resistor Rf is also electrically connected to the second end of the bonding pad capacitor Cp and the ground end GND, and forms a low-pass filter together with the filter capacitor Cf.

In this embodiment, in order to form the above-mentioned circuit layout, for example, the patterned metal layers M1, M2 and the dielectric layer D1 disposed between the patterned metal layers M1, M2 are used to form the bonding pad capacitor Cp, and the patterned metal layers M3, M4 and the dielectric layer D3 disposed between the patterned metal layers M3, M4 are used to form the filter capacitor Cf. The patterned metal layer M2 and the patterned metal layer M4 are insulated from each other by the dielectric layer D3, and as for the way in which the bonding pad capacitor Cp is electrically connected to the filter capacitor Cf, in this embodiment, for example, the patterned metal layer M2 can be connected to the patterned metal layer M3, such as through a plurality of conductive connectors (e.g., multiple conductive through holes) forming in the dielectric layer D2, but the present disclosure is not limited thereto. Specifically, the present disclosure does not limit a quantity and locations of the patterned metal layers and the dielectric layers used to form the bonding pad capacitor Cp and the filter capacitor Cf, nor does it limit the way in which the bonding pad capacitor Cp is electrically connected to the filter capacitor Cf.

In addition, the patterned metal layers M1, M2, M3 and M4 can be arranged in a circuit substrate (e.g., an integrated circuit, a printed circuit board), and are respectively located in multiple metal layers arranged from top to bottom, for example, respectively located in a first layer (e.g., a top layer), the second layer, . . . , the N−1th layer (e.g., a fifth layer) and the Nth layer (e.g., a bottom layer) of the circuit substrate, where N is a positive integer. The metal layers between the second layer to the N−1th layer (e.g., the fifth layer) can be reserved for forming a DC isolation capacitor Cdb, but the present disclosure is not limited thereto.

On the other hand, an input end of the DC isolation capacitor Cdb is electrically connected to the second end of the bonding pad capacitor, and another end of the DC isolation capacitor Cdb is electrically connected to the core circuit of the receiving circuit RXc. In short, the DC isolation capacitor Cdb is configured between the second end of the bonding pad capacitor Cp and the core circuit of the receiving circuit RXc. The core circuit RXc can include, for example, a bias circuit 10, a load circuit 12, and a transistor 14, but the present disclosure is not limited thereto. The DC isolation capacitor Cdb can be disposed in a circuit substrate having patterned metal layers M1, M2, M3 and M4, and can be a metal-insulator-metal (MIM) capacitor, a finger capacitor or a parallel plate capacitor. In this embodiment, in order to form the above circuit layout, the DC isolation capacitor Cdb can include patterned metal layers M5 and M6 (used as upper and lower electrodes), and a dielectric layer D4 disposed between the patterned metal layers M5 and M6. When the DC isolation capacitor Cdb is implemented by the MIM capacitor, the MIM capacitor can further include an additional patterned metal layer disposed between the patterned metal layers M5 and M6 to reduce a thickness of the dielectric layer between the upper and lower electrodes and increase a capacitance thereof. In the MIM capacitor, the thickness of the dielectric layer between patterned metal layers can be less than a thickness between two metal layers in the circuit substrate. Therefore, the MIM capacitor has a capacitance per unit area larger than that of a planar capacitor, but the breakdown voltage is about several volts.

In this embodiment, the patterned metal layer M5 can be a metal layer (e.g., a third layer of the circuit substrate) disposed between a metal layer corresponding to the patterned metal layer M2 (e.g., a second layer of the circuit substrate) and a metal layer corresponding to the patterned metal layer M3 (for example, a fifth layer of the circuit substrate); the patterned metal layer M6 can be a metal layer (for example, the fourth layer of the circuit substrate) disposed between a metal layer corresponding to the patterned metal layer M2 (for example, the second layer of the circuit substrate) and a metal layer corresponding to the patterned metal layer M3 (for example, the fifth layer of the circuit substrate), or can be disposed in the same metal layer (for example, the fifth layer of the circuit substrate) as the patterned metal layer M3. Therefore, the patterned metal layer M6 can be electrically connected to the patterned metal layer M3 through a patterned conductive line T1, and the filter resistor Rf can also be electrically connected to the patterned conductive line T1 and the ground end GND.

As shown in FIG. 1, an electrostatic discharge (ESD) event may occur during a wire-bonding process for die attachment, such as at a position where a lightning-like pattern is located. When the ESD event occurs, it may cause damage to the receiving circuit RX. It should be noted that, in order to improve the common mode transient immunity (CMTI) performance, the present disclosure does not additionally set an electrostatic discharge protection (ESD) component (e.g., a Zener diode) under the input pad of the receiving circuit RX, but instead designs the protection circuit architecture PT and applies it to the receiving circuit RX, so as to form an off-chip receiving circuit architecture that is resistant to electrostatic discharge.

Figure 2:
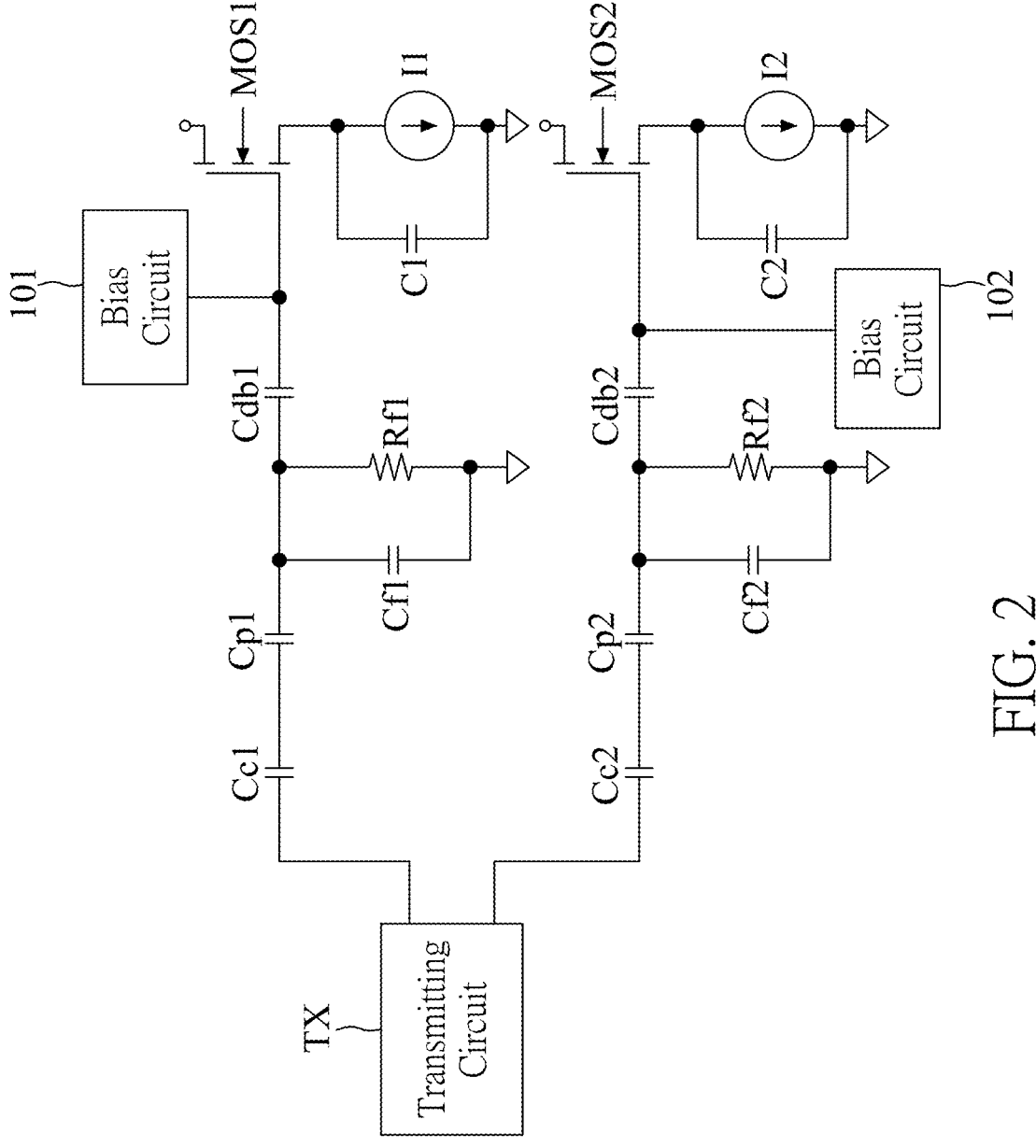
FIG. 2 is an equivalent circuit diagram of a capacitive coupling isolation device according to the first embodiment of the present disclosure.

Referring to FIG. 2, FIG. 2 is an equivalent circuit diagram of a capacitive coupling isolation device according to the first embodiment of the present disclosure, and for the convenience of explanation, the equivalent circuit of the transmitting circuit TX is omitted. Two physical links between transmitter circuit and receiver circuit are presented in FIG. 2. FIG. 2 shows the equivalent circuit of the external coupling capacitor Cc and the receiving circuit RX (including the protection circuit architecture PT) of FIG. 1, but taking two physical links as an example, a capacitor C1 and a current source I1 can be used as one of "+" physical link and "−" physical link of the differential operating mode, and a capacitor C2 and a current source I2 can be used as another one of "−" physical link and "+" physical link of the differential operating mode. As shown in FIG. 2, a bonding pad capacitor Cp1 is connected in series with an external coupling capacitor Cc1, and a bonding pad capacitor Cp2 is connected in series with an external coupling capacitor Cc2, which results in a smaller coupling capacitor. However, most of the voltage generated in an ESD event falls on the bonding pad capacitors Cp1 and Cp2.

In the capacitive coupling isolation device 1, the transmitter circuit TX and the receiver circuit RX are operating in differential modes to meet common mode transient immunity (CMTI) requirements. There are "+" and "−" physical links between the transmitter circuit TX and the receiver circuit RX for each communication channel. Each physical link has a built-in package coupling capacitor, there are a pair of external coupling capacitors (i.e., Cc1/Cc2) in one channel capacitive coupling isolation device. One end of the external coupling capacitor is electrically connected to the transmitter circuit TX, and another end of this external coupling capacitor is electrically connected to the receiver circuit RX. The protection circuit architecture in the following examples of the "+" and the "−" physical links are the same. For simplicity, the protection circuit architecture in one physical link is explained.

Furthermore, the filter resistor Rf1 and the filter capacitor Cf1 together form an RC low-pass filter, and the filter resistor Rf2 and the filter capacitor Cf2 together form another RC low-pass filter, which helps to release the charge generated by the ESD event to the ground end GND. The DC isolation capacitors Cdb1 and Cdb2 can filter the input signal into an RF signal without a DC component, and the bias circuits 101 and 102 provide DC bias voltages. When the bonding pad capacitors Cp1/Cp2 and the DC isolation capacitors Cdb1/Cdb2 work together, it will help reduce ESD voltage drops and ESD voltage durations at the transistors MOS1 and MOS2. Therefore, in this embodiment, the receiving circuit RX can be protected from damage by ESD events by setting the protection circuit architecture in the receiving circuit RX without adding an ESD component (e.g., Zener diodes) under the input pad of the receiving circuit RX.

Figure 3:
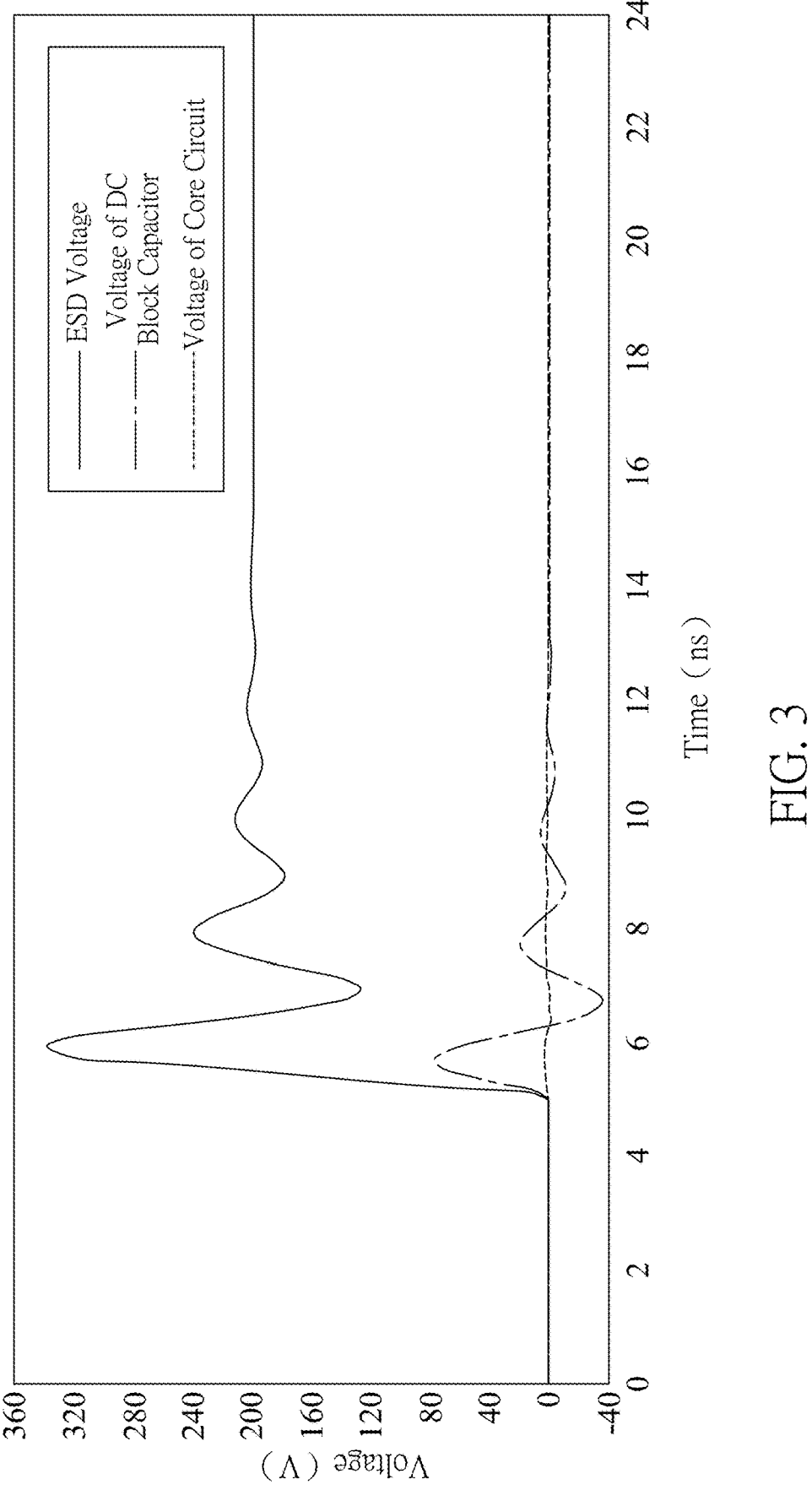
FIG. 3 is a simulation result of the capacitive coupling isolation device according to the first embodiment of the present disclosure.

FIG. 3 is an electrostatic discharge (ESD) simulation result of a machine mode (MM) of the capacitive coupling isolation device of the first embodiment of the present disclosure. FIG. 3 shows a voltage at a position where the ESD event occurs (located at the first end of the bonding pad capacitor Cp), a voltage on the DC isolation capacitor Cdb, and a voltage at the core circuit RXc of the capacitive coupling isolation device 1 using the protection circuit architecture PT of the present embodiment. As shown in FIG. 3, during the ESD event, the voltage at the position where the ESD event occurs (located at the first end of the bonding pad capacitor Cp) exceeds 200V, and the maximum voltage is as high as about 340V. After charges of the ESD event passing through the bonding pad structure IPD and the filter resistor Rf, most of the charges generated by the ESD event can be released to the ground end GND. Therefore, it can be seen from FIG. 3 that the voltage applied to the DC isolation capacitor Cdb (such as the MIM capacitor) has been greatly reduced. Although there is still a certain degree of voltage peak (about 80V), the duration is only about 2 ns. Therefore, it can be seen that the DC isolation capacitor Cdb (such as MIM capacitor) is also protected from being damaged by the ESD event.

In addition, the maximum voltage applied to the transistor 14 (see FIG. 1) in the core circuit RXc, which serves as a preamplifier, is less than 5V and lasts only 2 ns. Therefore, it can be clearly seen that the core circuit RXc is protected from electrostatic discharge. In short, it can be seen from the simulation result that, by providing the protection circuit architecture PT in the receiving circuit RX of the present embodiment, the receiving circuit RX can be protected from being damaged by the ESD event without additionally setting an ESD component (e.g., Zener diodes) under the input pad of the receiving circuit RX. In other words, compared to the related art, in the die bonding and packaging process, the off-chip receiving circuit RX of the present embodiment will not be damaged by the ESD event even if no additional ESD component is provided. On the contrary, it is worth mentioning that during the simulation process, the receiving circuit will be damaged by the ESD event if the protection circuit architecture PT of the present embodiment and the extra ESD component are not set.

Second Embodiment

Figure 4:
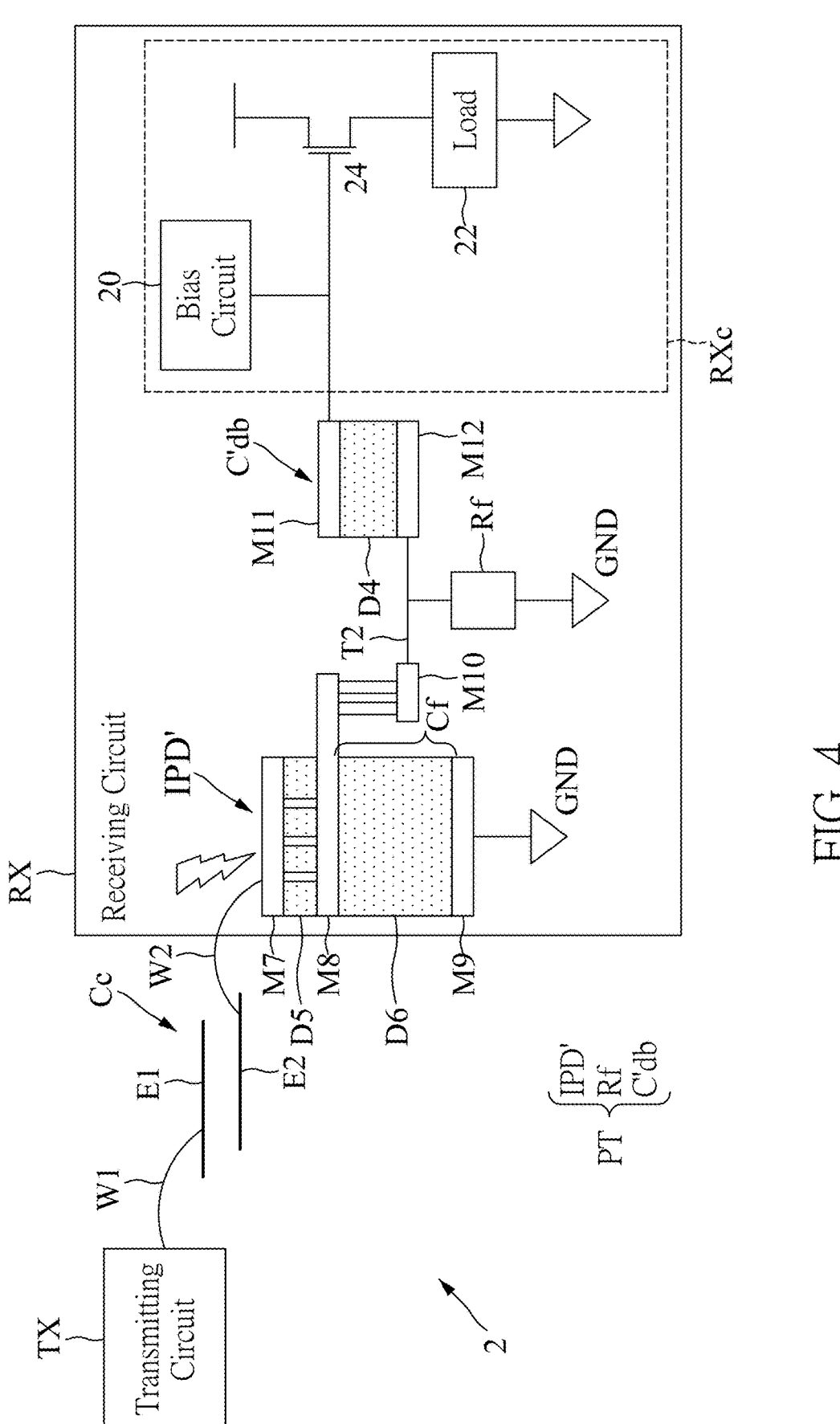
FIG. 4 is a schematic diagram of a capacitive coupling isolation device according to a second embodiment of the present disclosure.

FIG. 4 is a schematic diagram of a capacitive coupling isolation device according to a second embodiment of the present disclosure.

Referring to FIG. 4, the second embodiment of the present disclosure provides a capacitive coupling isolation device 2. It should be noted that the capacitive coupling isolation device 2 of FIG. 4 is similar to the capacitive coupling isolation device 1 of FIG. 1, and therefore the repeated descriptions of the same elements will be omitted and only the differences are described in detail.

Similarly, the external coupling capacitor Cc is a built-in package capacitor, which includes a first electrode plate E1, a second electrode plate E2, and a dielectric layer disposed between the first electrode plate E1 and the second electrode plate E2. A first end (i.e., the first electrode plate E1) of the external coupling capacitor Cc can be electrically connected to the transmitting circuit TX. Similarly, the first electrode plate E1 is electrically connected to the transmitting circuit TX by the first bonding wire W1, and the second electrode plate E2 is electrically connected to the input bonding pad structure IPD by the second bonding wire W2, but the present disclosure is not limited thereto. The present disclosure does not limit a manner in which the first electrode plate E1 is electrically connected to the transmitting circuit TX, and a manner in which the second electrode plate E2 is electrically connected to the input bonding pad structure IPD.

Specifically, the input bonding pad of the receiving circuit RX forms an input bonding pad structure IPD', which includes a plurality of patterned metal layers and a plurality of dielectric layers, such as patterned metal layers M7, M8 and M9 and dielectric layers D5 and D6, which are stacked alternately. The patterned metal layers M7, M8 and M9 can be made of conductive metal materials, such as copper. The dielectric layers D5 and D6 can be made of non-conductive materials, such as silicon dioxide (SiO2). Different from the first embodiment, in the input bonding pad structure IPD', the bonding pad capacitor Cp is omitted and only the filter capacitor Cf is provided.

The patterned metal layer M7 can be electrically connected to the second end of the external coupling capacitor Cc (i.e., the second electrode plate E2) through the second bonding wire W2, and can be connected to the patterned metal layer M8 through a plurality of conductive connectors, such as multiple conductive vias. The filter capacitor Cf includes patterned metal layers M8 and M9 and a dielectric layer D6 disposed between the patterned metal layers M8 and M9. The patterned metal layer M8 serves as a first end of the filter capacitor Cf. The patterned metal layer M9 serves as a second end of the filter capacitor Cf and is electrically connected to the ground end GND. From the circuit layout, the filter capacitor Cf is electrically connected to the second end (i.e., the second electrode plate E2) of the external coupling capacitor Cc and the ground end GND. In addition, the filter resistor Rf is also electrically connected to the first end of the filter capacitor Cf (i.e., the patterned metal layer M8) and the ground end GND, and forms a low-pass filter together with the filter capacitor Cf.

In this embodiment, in order to form the above circuit relationship, the patterned metal layers M8, M9 and the dielectric layer D6 disposed between the patterned metal layers M8, M9 are used to form a filter capacitor Cf. Regarding the way in which the external coupling capacitor Cc, the filter capacitor Cf and the filter resistor Rf are electrically connected, for example, in the present embodiment, the patterned metal layer M7 can be connected to the patterned metal layer M8, for example, through a plurality of conductive connectors, such as multiple conductive vias, and the patterned metal layer M8 can further extend outward from the position where the filter capacitor Cf is set, and be connected to a patterned metal layer M10 through a plurality of conductive connectors, such as conductive vias, and the filter resistor Rf is electrically connected to the patterned metal layer M10, and is electrically connected to the first end of the filter capacitor Cf (i.e., the patterned metal layer M8) and the second end of the external coupling capacitor Cc (i.e., the second electrode plate E2) through the patterned metal layer M10. However, the present disclosure is not limited thereto. Specifically, the present disclosure does not limit a quantity and positions of the patterned metal layers and dielectric layers used to form the filter capacitor Cf, nor does it limit the way in which the external coupling capacitor Cc, the filter capacitor Cf and the filter resistor Rf.

In addition, patterned metal layers M7, M8, M10 and M9 can be arranged in a circuit substrate (such as an integrated circuit, a printed circuit board), and are respectively located in multiple metal layers arranged from top to bottom, such as the first layer (for example: a top layer), the second layer, . . . , the N–1th layer (for example: the fifth layer), and the Nth layer (for example: the bottom layer) of the circuit substrate. The second layer to the N–1th layer (for example: the fifth layer) metal layers can be reserved for forming a subsequent DC isolation capacitor C'db, but the present disclosure not limited to this.

On the other hand, the DC isolation capacitor C'db is electrically connected to the second end of the external coupling capacitor Cc and the core circuit RXc of the receiving circuit RX. The core circuit RXc can include, for example, a bias circuit 20, a load circuit 22, and a transistor 24, but the present disclosure is not limited thereto. In addition, different from the first embodiment, in the second embodiment, the DC isolation capacitor C'db can be, for example, a parallel plate capacitor, which is disposed in the circuit substrate provided with the patterned metal layers M7, M8, M10 and M9. The DC isolation capacitor C'db can include patterned metal layers M11 and M12, and a dielectric layer D7 disposed between the patterned metal layers M11 and M12. The patterned metal layers M11 and M12 can be located in a portion of the metal layers of the circuit substrate, and can be located between the second layer to the N–1th layer (e.g., the fifth layer) of the metal layers of the circuit substrate. In this embodiment, the patterned metal layers M11 and M12 can be located in the same metal layer of the circuit substrate as the adjacent patterned metal layer M8 (e.g., the second metal layer) and the patterned metal layer M10 (e.g., the third metal layer), but the present disclosure is not limited thereto. The patterned metal layers M11 and M12 can be located in other two adjacent metal layers, respectively. The patterned metal layer M10 can be electrically connected to the patterned metal layer M12 through a patterned conductive line T2, and the filter resistor Rf can also be electrically connected to the patterned conductive line T2 and the ground end GND.

It should be noted that the DC isolation capacitor C'db in the second embodiment is, for example, a parallel plate capacitor, and an area of the DC isolation capacitor C'db is slightly larger than that of the DC isolation capacitor Cdb (MIM capacitor) in the first embodiment to get the same capacitance. In other embodiment, the area of the DC isolation capacitor C'db can be more larger than that of the DC isolation capacitor Cdb (MIM capacitor) in the first embodiment to get larger coupling capacitance, and this depends on requirement. Moreover, the dielectric layer D7 between the patterned metal layers M11 and M12 of the DC isolation capacitor C'db can be made of silicon dioxide, which has a greater thickness than the dielectric layer of the MIM capacitor, for example, the thickness can be greater than 700 nm, such that the breakdown voltage of the DC isolation capacitor C'db can be greater than 500V, which is better than the MIM capacitor. In addition, since the bonding pad capacitor Cp is omitted in this embodiment, the coupling capacitance can be larger, and more RF signals can be coupled to the core circuit RXc of the receiving circuit, such that an intensity of the received RF signal can be stronger.

As shown in FIG. 4, an ESD event may occur during a wire-bonding process for die attachment, such as at a position where a lightning-like pattern is located. When the ESD event occurs, it may cause damage to the receiving circuit RX. It should be noted that, in order to improve the CMTI performance, the present disclosure does not additionally set an electrostatic discharge protection (ESD) component (e.g., a Zener diode) under the input pad of the receiving circuit RX, but instead designs the protection circuit architecture and applies it to the receiving circuit RX, so as to form an off-chip receiving circuit architecture that is resistant to electrostatic discharge.

Figure 5:
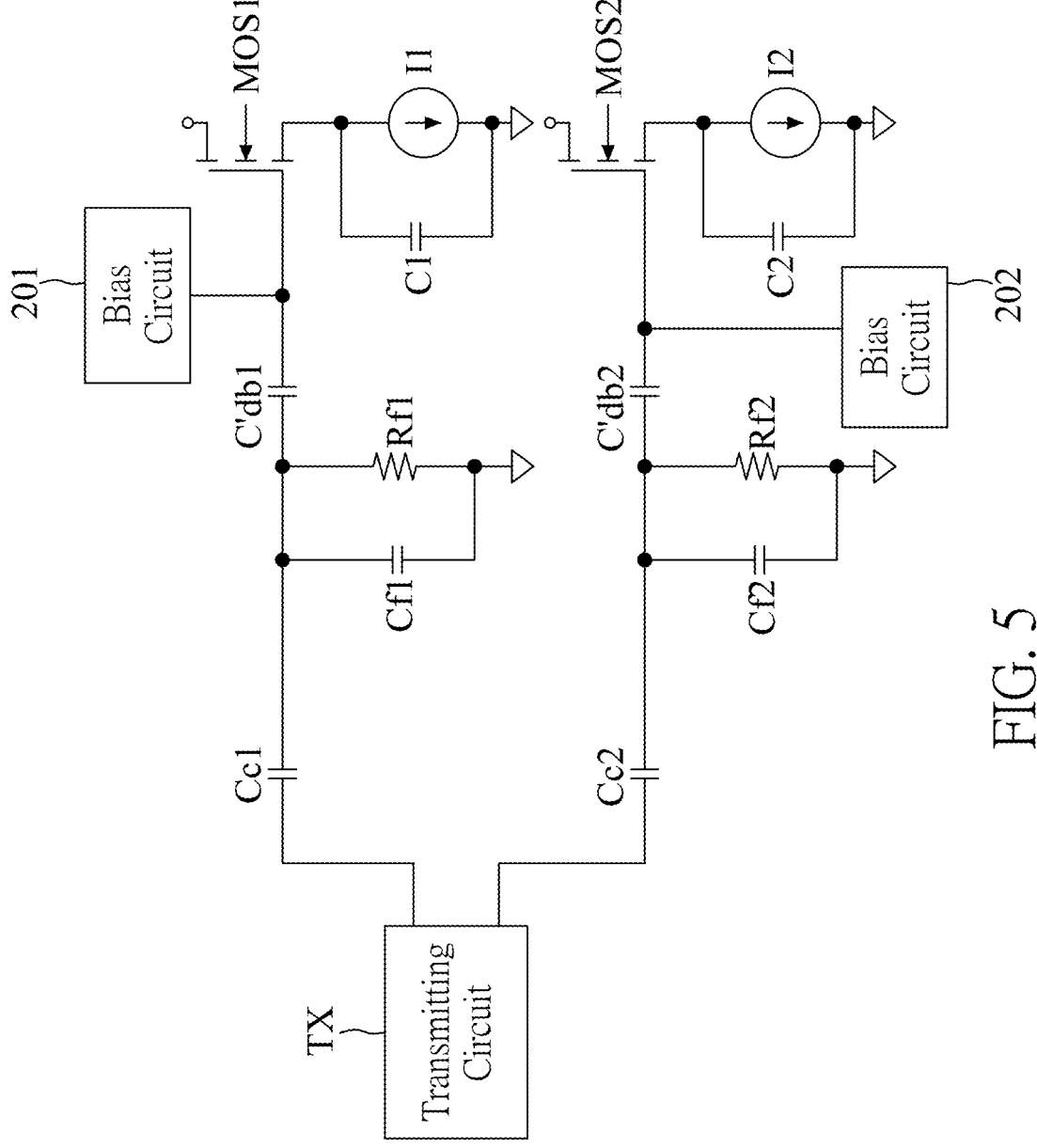
FIG. 5 is an equivalent circuit diagram of the capacitive coupling isolation device according to the second embodiment of the present disclosure.

Referring to FIG. 5, FIG. 5 is an equivalent circuit diagram of a capacitive coupling isolation device according to the second embodiment of the present disclosure, and for the convenience of explanation, the equivalent circuit of the transmitting circuit TX is omitted. FIG. 5 shows the equivalent circuit of the external coupling capacitor Cc and the receiving circuit RX (including the protection circuit architecture PT) of FIG. 4, but taking two physical links as an example, a capacitor C1 and a current source I1 can be used as one of "+" physical link and "–" physical link of the differential operating mode, and a capacitor C2 and a current source I2 can be used as another one of "–" physical link and "+" physical link of the differential operating mode. As shown in FIG. 5, a first end of the external coupling capacitor Cc1 is electrically connected to the transmitting circuit TX, and the filter resistor Rf1 and the filter capacitor Cf1 are connected in parallel to form a low-pass filter and are electrically connected to a second end of the external coupling capacitor Cc1 and the ground end GND. In addition, a first end of the external coupling capacitor Cc2 is electrically connected to the transmitting circuit TX, and the filter resistor Rf2 and the filter capacitor Cf2 together form another low-pass filter and are electrically connected to a second end of the external coupling capacitor Cc2 and the ground end GND. The two low-pass filters mentioned above help to release most of the charges generated by the ESD event occurring at the input pad of the receiving circuit RX (i.e., a position where the receiving circuit RX coupled to the second electrode plate E2) to the ground end GND. The DC isolation capacitors C'db1 and C'db2 can filter the input signal into an RF signal without a DC component, and the bias circuits 201 and 202 provide DC bias voltages.

Specifically, when the ESD event occurs, most of the voltage will be applied to the DC isolation capacitors C'db1 and C'db2, and the DC isolation capacitors C'db1 and C'db2 can withstand a voltage of at least 500V, thus helping to reduce the ESD voltage received by transistors MOS1 and MOS2 to below 5V. Therefore, by providing the protection circuit architecture PT in the receiving circuit RX, the present disclosure can protect the receiving circuit RX from being damaged by the ESD event without additionally setting an ESD component (e.g., a Zener diode) under the input pad of the receiving circuit RX.

Figure 6:
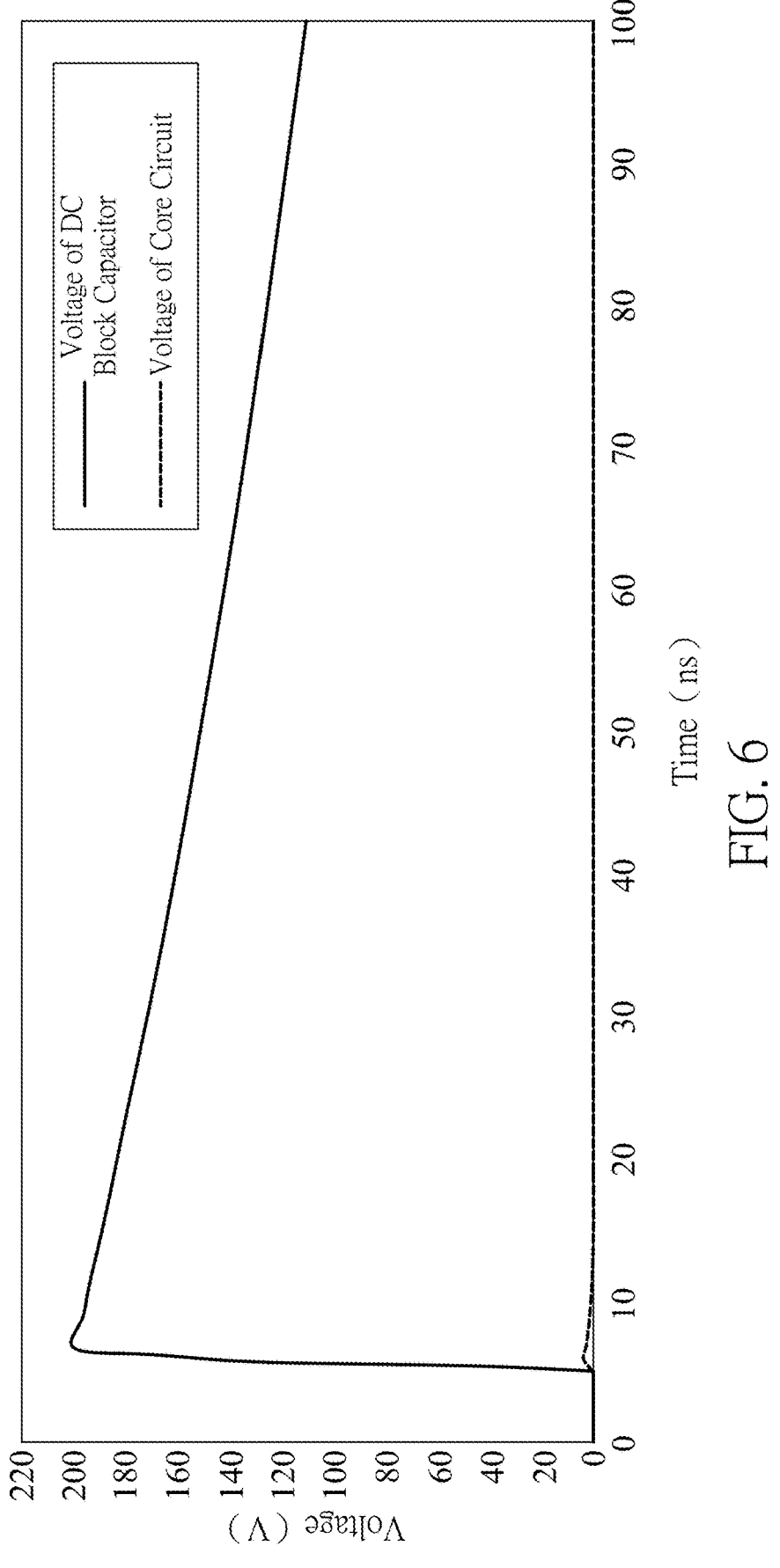
FIG. 6 is a simulation result of the capacitive coupling isolation device according to the second embodiment of the present disclosure.

FIG. 6 is an electrostatic discharge (ESD) simulation result of a machine mode (MM) of the capacitive coupling isolation device of the second embodiment of the present disclosure. FIG. 6 shows a voltage on the DC isolation capacitor C'db and a voltage at the core circuit RXc of the capacitive coupling isolation device 2 using the protection circuit architecture PT of the present embodiment. As shown in FIG. 6, during the ESD event, the maximum voltage applied to the DC isolation capacitor C'db (e.g., the plate capacitor) is about 200V, which does not exceed the maximum voltage that the DC isolation capacitor C'db can withstand (at least 500V), while the voltage applied to the transistor 24 (see FIG. 4) serving as a preamplifier in the core circuit RXc is less than 5V. It is known from experiments that, by providing the protection circuit architecture PT in the receiving circuit RX of the present embodiment, the receiving circuit RX can be protected from being damaged by the ESD event without additionally setting an ESD component (e.g., a Zener diode) under the input pad of the receiving circuit RX. In other words, in the die bonding and packaging process, compared to the related art, the off-chip receiving circuit RX of the present embodiment will not be damaged by the ESD event even if no additional ESD component is provided.

Beneficial Effects of the Embodiments

In conclusion, the capacitive coupling isolation device provided by the present disclosure, which includes a protection circuit architecture in the receiving circuit, can protect the receiving circuit from ESD events without the need for additional ESD components under the input pad of the receiving circuit. This protection is achieved through the coordinated operation of a built-in package capacitor, a pad capacitor, a low-pass filter formed by a filter capacitor and a filter resistor, and a MIM capacitor.

Furthermore, another capacitive coupling isolation device provided by the present disclosure, which includes a protection circuit architecture in the receiving circuit, can protect the receiving circuit from being damaged by ESD events without additionally providing the ESD components under the input pad of the receiving circuit. This protection is achieved through the coordinated operation of a built-in package capacitor, a low-pass filter formed by a filter capacitor and a filter resistor, and a high-withstand voltage parallel plate capacitor.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A capacitive coupling isolation device, comprising:
an external coupling capacitor having one end electrically connected to a transmitting circuit; and
a receiving circuit electrically connected to another end of the external coupling capacitor, wherein the receiving circuit includes:
a protection circuit architecture, including:
an input bonding pad structure formed by alternatively disposing a plurality of patterned metal layers and a plurality of dielectric layers, wherein the input bonding pad structure includes:
a pad capacitor having a first end electrically connected to the another end of the external coupling capacitor; and
a filter capacitor electrically connected to a second end of the pad capacitor and a ground end; and
a filter resistor electrically connected to the second end of the pad capacitor and the ground end, wherein the filter capacitor and the filter resistor form a low-pass filter;
wherein the external coupling capacitor is a built-in package capacitor that includes a first electrode plate and a second electrode plate, the first electrode plate is electrically connected to the transmitting circuit, and the second electrode plate is electrically connected to the first end of the pad capacitor.

2. The capacitive coupling isolation device according to claim 1, wherein the first electrode plate is electrically connected to the transmitting circuit by a first bonding wire, and the second electrode plate is electrically connected to the first end of the pad capacitor by a second bonding wire.

3. The capacitive coupling isolation device according to claim 1, wherein the plurality of patterned metal layers at least include a first patterned metal layer, a second patterned metal layer, a third patterned metal layer and a fourth patterned metal layer, and the plurality of dielectric layers at least include a first dielectric layer disposed between the first patterned metal layer and the second patterned metal layer, a second dielectric layer disposed between the second patterned metal layer and the third patterned metal layer, and a third dielectric layer disposed between the third patterned metal layer and the fourth patterned metal layer, and the first patterned metal layer, the first dielectric layer, the second patterned metal layer are used to form the pad capacitor, and the third patterned metal layer, the third dielectric layer and the fourth patterned metal layer are used to form the filter capacitor.

4. The capacitive coupling isolation device according to claim 3, wherein the second patterned metal layer is connected to the third patterned metal layer through a plurality of conductive connectors.

5. The capacitive coupling isolation device according to claim 4, wherein the first patterned metal layer, the second patterned metal layer, the third patterned metal layer and the fourth patterned metal layer are disposed in a circuit substrate, and are respectively located in a first metal layer, a second metal layer, an N−1th metal layer and an Nth metal layer arranged from top to bottom of the circuit substrate, where N is a positive integer.

6. The capacitive coupling isolation device according to claim 5, further comprising a direct current (DC) isolation capacitor electrically connected to the second end of the pad capacitor and a core circuit of the receiving circuit.

7. The capacitively coupled isolation device according to claim 6, wherein the DC isolation capacitor is a metal-insulator-metal (MIM) capacitor.

8. The capacitive coupling isolation device according to claim 7, wherein the MIM capacitor is disposed in the circuit substrate and includes a fifth patterned metal layer and a sixth patterned metal layer.

9. The capacitive coupling isolation device according to claim 8, wherein the fifth patterned metal layer is located in a third metal layer of the circuit substrate, and the sixth patterned metal layer is located in a fourth metal layer or the N−1th metal layer of the circuit substrate.

10. A capacitive coupling isolation device, comprising:
an external coupling capacitor having a first end electrically connected to a transmitting circuit; and
a receiving circuit electrically connected to a second end of the external coupling capacitor, wherein the receiving circuit includes:
a protection circuit architecture, including:
an input bonding pad structure formed by alternatively disposing a plurality of patterned metal layers and a plurality of dielectric layers, wherein the input bonding pad structure includes a filter capacitor electrically connected to the second end of the external coupling capacitor and a ground end;
a filter resistor electrically connected to the second end of the external coupling capacitor and the ground end, wherein the filter capacitor and the filter resistor form a low-pass filter; and
a direct current (DC) isolation capacitor electrically connected to the second end of the external coupling capacitor and a core circuit of the receiving circuit.

11. The capacitive coupling isolation device according to claim 10, wherein the plurality of patterned metal layers of the input bonding pad structure at least include a first patterned metal layer, a second patterned metal layer and a third patterned metal layer, and the plurality of dielectric layers at least include a first dielectric layer disposed between the first patterned metal layer and the second patterned metal layer and a second dielectric layer disposed between the second patterned metal layer and the third patterned metal layer, and the second patterned metal layer, the second dielectric layer and the third patterned metal layer are used to form the filtering capacitor.

12. The capacitive coupling isolation device according to claim 11, wherein the first patterned metal layer is connected to the second patterned metal layer through a plurality of conductive connectors.

13. The capacitive coupling isolation device according to claim 11, wherein the plurality of patterned metal layers of the input bonding pad structure further include a fourth patterned metal layer, the plurality of dielectric layers further include a third dielectric layer, the fourth patterned metal layer is located between the first patterned metal layer and the second patterned metal layer, and the first patterned metal layer, the fourth patterned metal layer and the third dielectric layer located between the first patterned metal layer and the fourth patterned metal layer form a pad capacitor, and the first patterned metal layer is electrically connected to the second end of the external coupling capacitor.

14. The capacitive coupling isolation device according to claim 13, wherein the DC isolation capacitor is a finger capacitor, a parallel plate capacitor or a metal-insulator-metal (MIM) capacitor, the DC isolation capacitor at least includes a fifth patterned metal layer, a sixth patterned metal layer, and a fourth dielectric layer located between the fifth patterned metal layer and the sixth patterned metal layer.

15. The capacitive coupling isolation device according to claim 14, wherein the plurality of patterned metal layers are disposed in a circuit substrate, and the sixth patterned metal layer of the DC isolation capacitor is electrically connected to the filter capacitor through a patterned conductive line.

16. The capacitive coupling isolation device according to claim 11, wherein the external coupling capacitor is a built-in package capacitor that includes a first electrode plate and a second electrode plate, the first electrode plate is electrically connected to the transmitting circuit, and the second electrode plate is electrically connected to the first patterned metal layer.

17. The capacitive coupling isolation device according to claim 11, wherein the DC isolation capacitor is a finger capacitor, a parallel plate capacitor or a metal-insulator-metal (MIM) capacitor, the DC isolation capacitor at least includes a fifth patterned metal layer, a sixth patterned metal layer, and a fourth dielectric layer located between the fifth patterned metal layer and the sixth patterned metal layer.

18. The capacitive coupling isolation device according to claim 17, wherein the plurality of patterned metal layers are disposed in a circuit substrate, and the sixth patterned metal layer of the DC isolation capacitor is electrically connected to the filter capacitor through a patterned conductive line.

19. A receiving circuit, applicable to an isolation device, and the receiving circuit comprising:
a protection circuit architecture, including:
an input bonding pad structure at least including a first patterned metal layer, a second patterned metal layer, a first dielectric layer located between the first patterned metal layer and the second patterned metal layer, a third patterned metal layer, and a second dielectric layer located between the second patterned metal layer and the third patterned metal layer, wherein the second patterned metal layer, the second dielectric layer, and the third patterned metal layer form a filter capacitor, one end of the filter capacitor is electrically connected to an external coupling capacitor through the first patterned metal layer, and another end of the filter capacitor is electrically connected to a ground end; and
a filter resistor electrically connected to the second patterned metal layer and the ground end, wherein the filter capacitor and the filter resistor form a low-pass filter.

20. The receiving circuit according to claim 19, wherein the input bonding pad structure further includes a fourth patterned metal layer and a third dielectric layer, the fourth patterned metal layer is located between the first patterned metal layer and the second patterned metal layer, the first patterned metal layer, the fourth patterned metal layer and the third dielectric layer located between the first patterned metal layer and the fourth patterned metal layer form a pad capacitor, and the first patterned metal layer is electrically connected to the external coupling capacitor.

21. The receiving circuit according to claim 20, wherein the fourth patterned metal layer is connected to the second patterned metal layer through a plurality of conductive connectors.

22. The receiving circuit according to claim 19, wherein the external coupling capacitor is a built-in package capacitor that includes a first electrode plate and a second electrode plate, the first electrode plate is electrically connected to a transmitting circuit, and the second electrode plate is electrically connected to the first patterned metal layer.

23. The receiving circuit according to claim 19, further comprising a direct current (DC) isolation capacitor electrically connected to the second patterned metal layer and a core circuit of the receiving circuit.

24. The receiving circuit according to claim 19, wherein the first patterned metal layer is connected to the second patterned metal layer through a plurality of conductive connectors.

\* \* \* \* \*